United States Patent [19]

Mullen, III et al.

[11] Patent Number: 5,241,133
[45] Date of Patent: Aug. 31, 1993

[54] LEADLESS PAD ARRAY CHIP CARRIER

[75] Inventors: William B. Mullen, III, Boca Raton; Glenn F. Urbish, Coral Springs; Bruce J. Freyman, Plantation, all of Fla.

[73] Assignee: Motorola, Inc., Schaumburg, Ill.

[21] Appl. No.: 976,720

[22] Filed: Nov. 16, 1992

Related U.S. Application Data

[63] Continuation of Ser. No. 631,848, Dec. 21, 1990, abandoned.

[51] Int. Cl.⁵ ............... H01L 23/02; H01L 23/28; H05K 7/00
[52] U.S. Cl. .................. 174/52.4; 257/787; 257/693; 257/774; 257/786; 174/52.2; 361/728; 361/736; 361/768; 361/777
[58] Field of Search ............ 174/52.2, 52.4, 260; 257/678, 684, 687, 693, 698, 701, 704, 774, 779, 786, 787, 788, 792; 361/392, 395, 397, 399, 400, 401, 402–403, 409

[56] References Cited

U.S. PATENT DOCUMENTS

| | | | |
|---|---|---|---|
| 4,460,537 | 7/1984 | Heinle | 264/272.17 |
| 4,688,152 | 8/1987 | Chia | 316/408 |
| 4,822,550 | 4/1989 | Komathu | 264/263 |
| 4,935,581 | 6/1990 | Komathu | 174/52.4 |
| 4,961,105 | 10/1990 | Yamamoto | 174/52.4 |
| 4,975,765 | 12/1990 | Ackermann et al. | 357/80 |
| 5,019,673 | 5/1991 | Juskey et al. | 174/52.2 |
| 5,107,329 | 4/1992 | Okinaga et al. | 357/74 |

FOREIGN PATENT DOCUMENTS

| | | | |
|---|---|---|---|
| 57-79652 | 5/1982 | Japan . | |
| 0274735 | 11/1987 | Japan | 357/72 |
| 0283147 | 11/1988 | Japan . | |
| 2-128453 | 5/1990 | Japan . | |
| 0251165 | 10/1990 | Japan | 357/72 |

Primary Examiner—Leo P. Picard
Assistant Examiner—Bot Ledynh
Attorney, Agent, or Firm—Dale W. Dorinski

[57] ABSTRACT

A leadless pad array chip carrier package is disclosed, employing a printed circuit board (22) having an array of solder pads (34) on the bottom side. A semiconductor device (24) is electrically wire bonded (49) and attached with conductive adhesive (47) to the metallization patterns (43, 25) of the printed circuit board (22). A protective plastic cover (26) is transfer molded about the semiconductor device (24) covering substantially all of the top side of the printed circuit board (22).

11 Claims, 6 Drawing Sheets

LEADLESS PAD ARRAY CHIP CARRIER

This is a continuation of U.S. application Ser. No. 07/631,848, filed Dec. 21, 1990, and now abandoned.

TECHNICAL FIELD

This invention relates generally to electronic devices, and in particular to packages for semiconductor devices, and most particularly to transfer molded leadless semiconductor packages.

BACKGROUND

Pin grid array packages have become a popular form of integrated circuit packaging, as they provide for a large number of pins in a plug-in type package. An array of pins having a standard spacing (for example, 100 mils center to center) is located on a ceramic substrate so that the pins extends outward from one face of the substrate to join with sockets on a main printed circuit board. An integrated circuit or semiconductor device is mounted on the top side of the ceramic substrate and wire bonds are made between the bonding pads of the integrated circuit and the traces on the substrate. The integrated circuit, the leads, and the wire bonds are then covered with an encapsulant to complete the package.

Two types of encapsulation methods have been used. In the first, the integrated circuit chip and associated interconnections are encapsulated in a plastic resin, as in glob top or chip-on-board technology. In the second method, the assembly is encapsulated by transfer molding a thermoset plastic composition over the device and the ceramic substrate. In transfer molding, the assembly to be encapsulated is located inside a metal mold which has recesses defining the shape of the cover to be produced. Solid plastic is heated and forced under pressure through gates into the mold. The heat and pressure causes the plastic to liquify and flow into the mold cavities surrounding the integrated circuit. The mold is heated to cure the plastic and the molded assembly is then removed from the mold. The basic characteristics of transfer molding are taught in U.S. Pat. No. 4,460,537.

The structure of a plastic pin grid array assembly is similar to its ceramic equivalent. Instead of using a ceramic substrate, low-cost materials such as epoxy-glass or polyester-glass printed circuit boards are used for the substrate. The fabrication of these substrates shares most of the same assembly processes and techniques with conventional printed circuit board manufacturing processes. The pins of the package are inserted into plated-through holes in the circuit board and either press-fit or reflow soldered.

Referring to FIG. 1a and FIG. 1b in the prior art, plastic molded pin grid arrays 10 are formed about a substrate 12 containing an array of pins 14 extending from the bottom of the substrate 12. A plastic compound 16 is transfer-molded about the substrate to form a completed package. The substrate is registered in the mold by locating the edges of the substrate 12 against registration bumps in the mold. After the molding is completed, the registration bumps appear in the finished pin grid array package as indentations or ribs 13. Alternate methods and configurations of forming molded pin grid array packages employ slanted side walls 18 to aid in removal of the molded part from the molding press. Such a transfer-molded plastic pin grid array package is taught in U.S. Pat. No. 4,935,581.

The advantages of a plastic pin grid array as compared to a ceramic pin grid array are low cost and better electrical performance. However, despite these advantages, low-density and fragile pins remain major concerns in pin grid array packages. Because of the requirement to attach leaded pins to the substrate, there is an inherent density limitation in pin grid array packages. Conventional packages utilize pins placed at 100 mil centers and newer packages promise density increases with 50 mil center pins, but at a significant expense. In order to achieve 50 mil centers, expensive multilayer substrate construction must be used. In addition, the cost of fabricating and attaching the pins is high. Large pin grid array packages are difficult to assemble into the main circuit board because of bent and skewed package leads. As the size of the package increases, these problems become greatly magnified. The high density 50 mil center packages are particularly prone to bent leads due to the small diameter of the leads.

The use of large integrated circuit chips is also restricted when using plastic pin grid array packages. Conventional wisdom dictates that these packages are used only for consumer electronics applications with small integrated circuit chips requiring plug in chip carriers. When larger chips are used, ceramic substrates are employed to accommodate the thermal expansion mismatch between the substrate and the silicon chip. Clearly, a need exists for a low-cost, high density plastic package that would overcome the inherent problems of density, lead fragility, electrical performance, cost, and reliability found in conventional ceramic and printed circuit board pin grid array packages.

SUMMARY OF THE INVENTION

Briefly, according to the invention, a pad array chip carrier package is provided, comprising a resinous circuit carrying substrate having an array of solder pads on the bottom side and a semiconductor device electrically and mechanically mounted on the top side. A protective plastic cover is transfer molded about the semiconductor device, covering substantially all of the top side of the circuit carrying substrate.

In an alternate embodiment of the invention, solder bumps are formed on the solder pads in order to provide a pad array chip carrier package that is easily soldered to a main circuit board.

In a further embodiment of the invention, a metal stiffener is bonded to the circuit carrying substrate under the semiconductor device. The semiconductor device is electrically connected to the substrate and a cover is transfer molded about the semiconductor device, covering substantially all of the top side of the circuit carrying substrate.

DETAILED DESCRIPTION OF THE PREFERRED EMBODIMENT

Figure 1A:
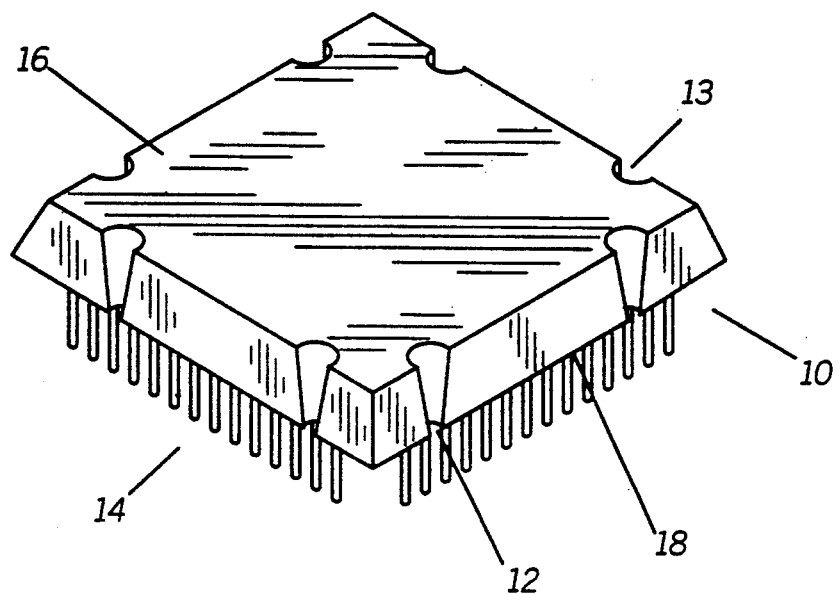
FIG. 1a is a perspective view of a prior art pin grid array package.
Figure 1B:
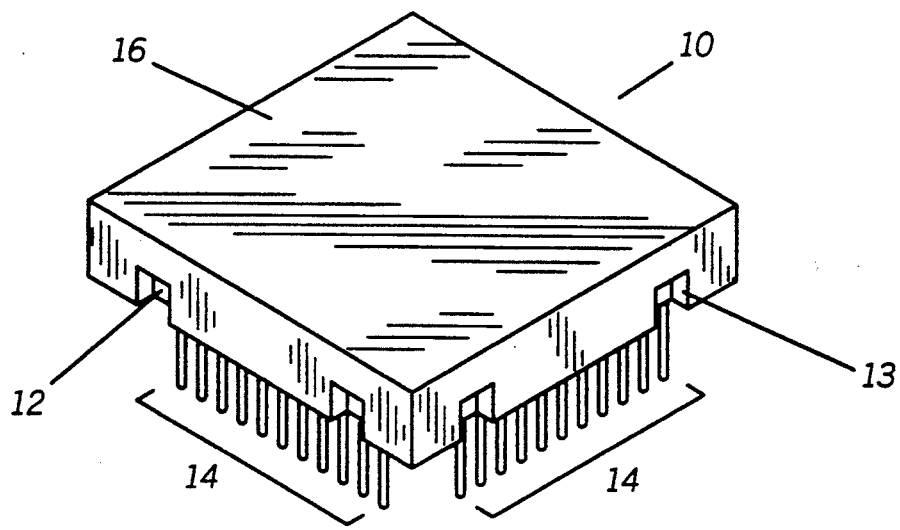
FIG. 1b is a perspective view of a prior art pin grid array package.
Figure 2:
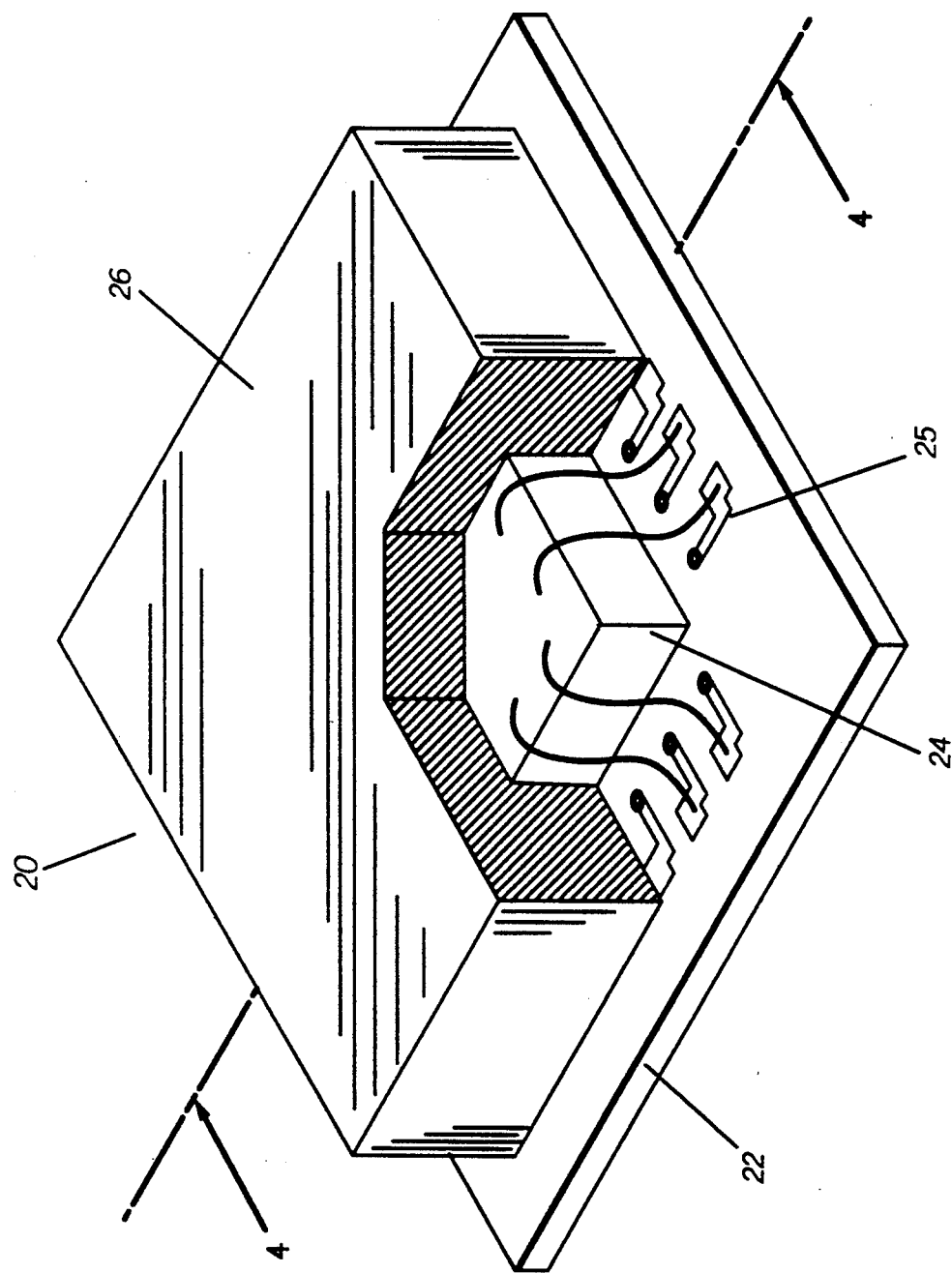
FIG. 2 is a perspective cut-away view of a resin-molded pad array chip carrier in accordance with the present invention.

Referring to FIG. 2, a leadless, transfer-molded, pad array chip carrier 20 is made by placing an integrated circuit chip or semiconductor device 24 on a circuit-carrying substrate 22. The circuit carrying substrate is a resinous printed circuit board such as epoxy-glass or polyimide-glass, but may also consist of other materials such as flexible circuitry made from polyimide, polyester, or polyetherimide film. The substrate 22 has a metallization pattern 25 on the upper surface of the substrate. The integrated circuit 24 is adhesively bonded or eutectic bonded to the substrate 22 and wire-bonded to the metallization pattern 25. The integrated circuit 24 may also be attached to the substrate 22 by flip-chip bonding or by tape-automated-bonding (TAB). The substrate and chip assembly is then placed into a molding machine. Typically, a transfer molding machine is used, but other methods of molding such as injection molding or reaction injection molding (RIM) may be employed, depending on the materials selected. Transfer molding utilizes thermosetting materials, whereas injection molding utilizes thermoplastic materials and RIM utilizes materials that are thermoplastic but react within the mold to form thermosets. A cover 26 is molded about the chip in order to encapsulate and cover the chip and all the associated interconnections. In practice, the molding compound 26 may extend to the edges of the substrate 22 but will preferably terminate at a distance from the edges of the substrate 22 in order to provide a means for holding or securing the substrate while it is in the mold. By extending the substrate 22 beyond the body of the molding compound 26, the need to have notches or ribs in the molded body (as in the prior art) is obviated.

Figure 3:
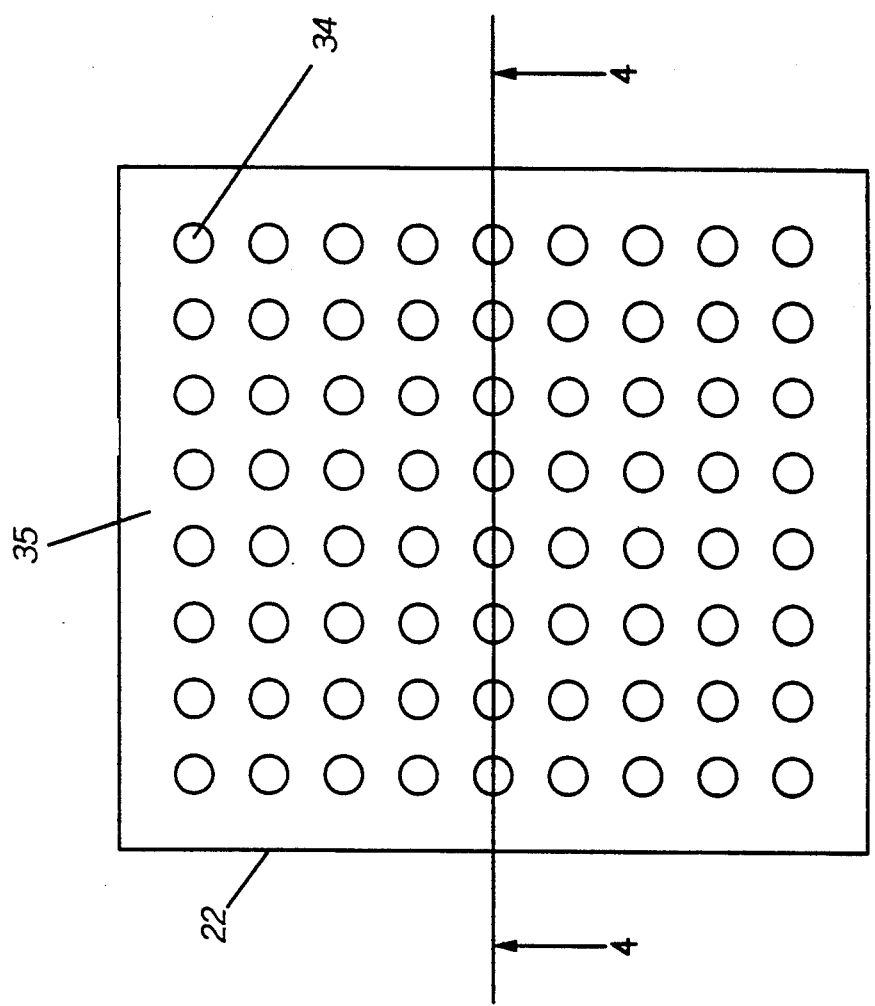
FIG. 3 is a plan view of the bottom of a pad array chip carrier in accordance with the present invention.

The bottom side of the substrate 22 contains an array 35 of solder pads 34 arranged in a particular configuration (see FIG. 3). The solder pads are typically circular but may assume other shapes. The solder pads 34 serve to provide the electrical interconnection between the pad array chip carrier and a main circuit board (not shown). The solder pads 34 are made from the same metallization as the remainder of the circuit board, typically copper, and may be coated with another material such as gold to prevent oxidation of the solder pads. If the pad array chip carrier is to be soldered to the main printed circuit board, the solder pads may be coated with solder plating or reflowed with solder paste, solder spheres, or other methods to create solder bumps on the solder pads.

Figure 4:
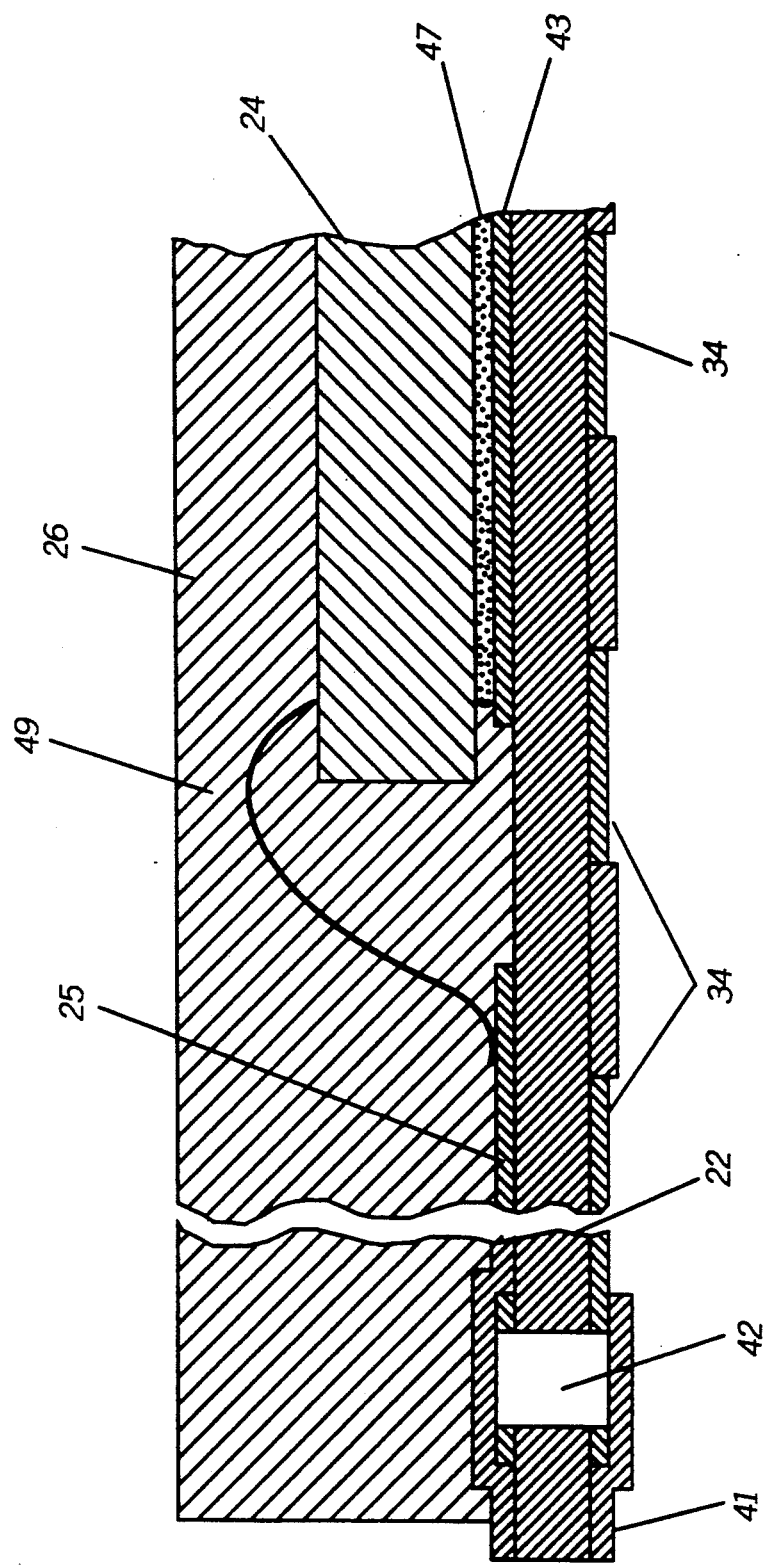
FIG. 4 is a fragmentary sectional view of FIGS. 2 and 3 through section AA.

Referring to FIG. 4, the substrate 22 contains a chip bonding metallization pad 43 to which the chip 24 is attached using a conductive adhesive 47. Other means of attachment, such as eutectic bonding, may also be used. The chip is electrically wire-bonded by thin metal wires 49, typically gold or aluminum, to the metallization pattern 25. The electrical connection from the metallization pattern 25 to the solder pads 34 is effected with plated-through-holes 42. The metallization pattern 25 on the top surface of the printed circuit board terminates as an annular ring at a plated-through-hole 42. The electrical connection on the bottom side of the printed circuit board is made by connecting the plated-through-hole 42 to another annular ring and extending the metallization pattern to the solder pads 34. Typically, a solder mask 41 is placed over the metallization patterns and plated-through-holes 42, but may be eliminated or only partially employed as required. After mounting the chip and making the electrical connections, the assembly is transfer-molded using a thermoplastic or thermoset molding compound, preferably a thermoset epoxy. The molding compound 26 encapsulates the chip 24 and wire-bonds 49, and covers nearly all the top surface of the printed circuit board 22. It can be seen that the upper surface of the printed circuit board is not totally covered by the molding compound, but a small portion around the peripheral edge of the molding compound is left exposed in order to facilitate fixturing the assembly in the mold and subsequent handling during assembly operations. By revealing a portion of the upper surface of the printed circuit board on the perimeter of the chip carrier, the need to provide ribs or indentations in the cover to aid in molding is eliminated. Depending on the configuration desired, the exposed portion of the circuit board can be on one, two, three, or all four sides of the cover.

Figure 5:
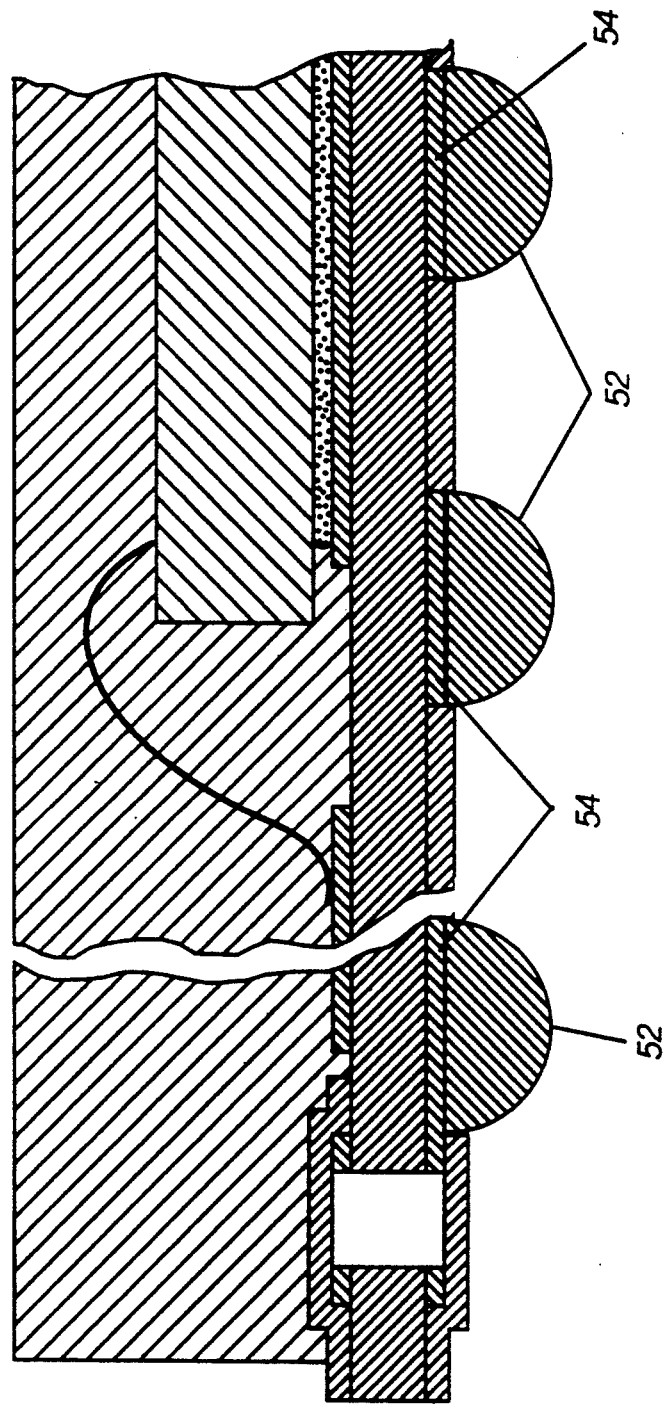
FIG. 5 is the same fragmentary sectional view of an alternate embodiment of the invention.

An alternate embodiment of the invention (FIG. 5) employs solder bumps 52 on the solder pads 54 to create a array of bumped solder pads. The use of solder bumps allows the pad array chip carrier to be easily soldered to the solder pads on the main circuit board (not shown). The height of the solder bump must be sufficient to effect a surface mount interconnect, typically from about 3 to about 30 mils high, and of about the same diameter as the solder pad 54.

Figure 6:
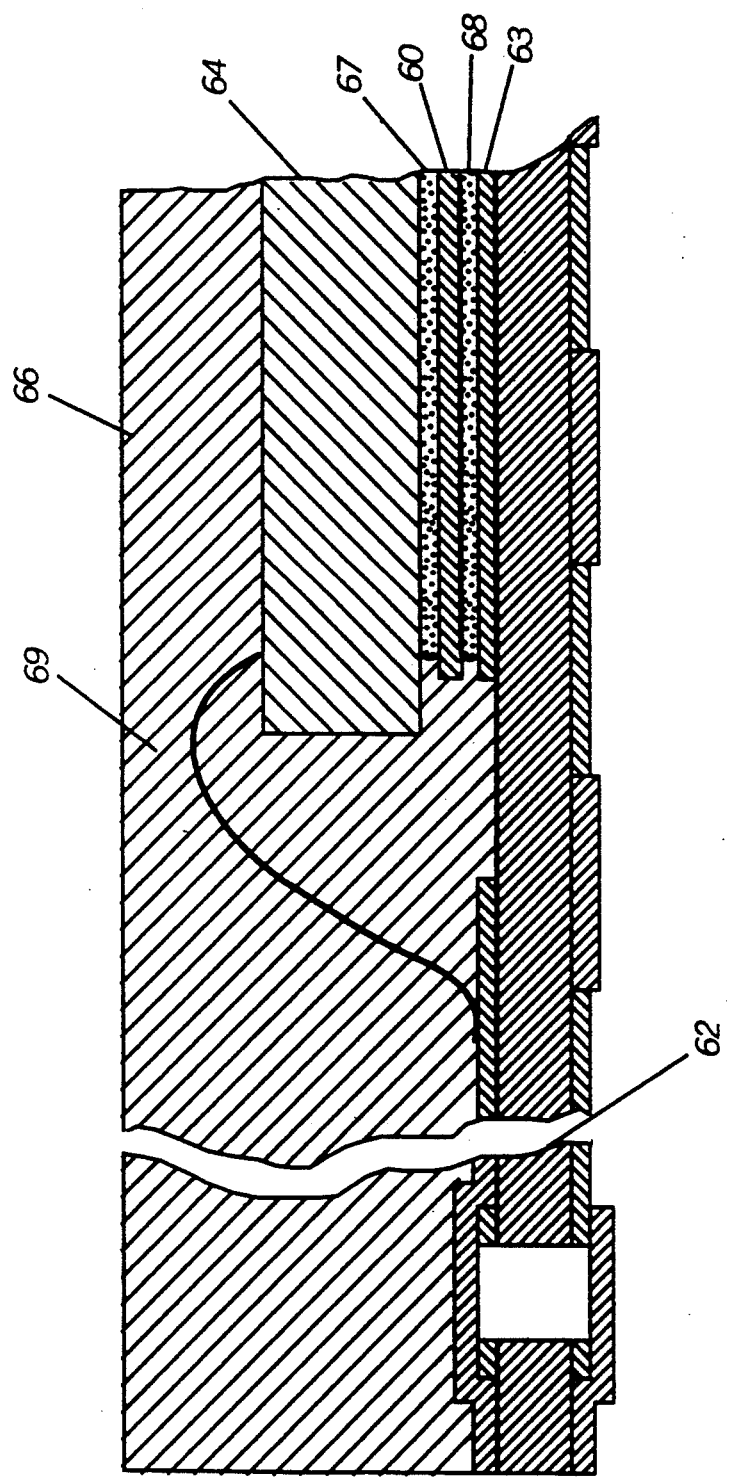
FIG. 6 is the same fragmentary sectional view of another embodiment of the invention.

A further embodiment of the invention (FIG. 6) employs a metal member or stiffener 60 made from a thin sheet of a material such as steel, nickel, copper clad invar, alloy 42, or other materials having a flexural modulus in excess of about 2,000,000 psi. The thickness of the stiffener varies from about 3 to about 10 mils depending of the type of material used. The stiffener is adhesively bonded to the pad 63 of the printed circuit board 62 using an adhesive material 68. The chip 64 is then attached to the stiffener 60 using a conductive adhesive 67 as in the previous example. The metal stiffener acts to reduce the mechanical stress imparted by the mismatch between the thermal expansion coefficients of the printed circuit board and the silicon chip. By reducing this stress, larger integrated circuit chips may be used in the plastic pad array chip carrier package. Electrical connections are made between the chip and the circuit board 62 by wire bonds 69 in the same manner as the earlier embodiment. A cover 66 is molded as in the previous example to encapsulate the integrated circuit 64, the wire bonds 69, the stiffener 60, and the top surface of the printed circuit board 62.

Further increases in density may be achieved by using multi-layer circuit board construction and blind vias. By eliminating the need for pins, chip carriers with interconnection spacing as small as twenty mils center-to-center may be achieved. Larger integrated circuits may be mounted and encapsulated, and a low cost package can be easily fabricated.

Various changes and modifications in the pad array chip carrier herein disclosed may occur to those skilled in the art; and to the extent that such changes and modifications are embraced by the appended claims, it is to be understood that they constitute part of the present invention.

What is claimed is:

1. A leadless pad array chip carrier package, comprising:

a leadless circuit carrying insulating substrate having opposing planar first and second sides;

a semiconductor device electrically and mechanically mounted on the first side of the circuit carrying substrate;

the substrate second side having a substantially coplanar array of surface mount solder pads arranged in checkerboard fashion to substantially cover the substrate second side, a portion of the array disposed below the semiconductor device;

the semiconductor device electrically connected to the surface mount solder pads by means of vias through the leadless circuit carrying substrate, each of said vias positioned away from said surface mount solder pads; and a protective cover consisting of a resin transfer molded about the semiconductor device and covering a portion of the first side of the leadless circuit carrying substrate, to form a leadless pad array chip carrier.

2. The leadless pad array chip carrier package of claim 1, wherein the protective cover is smaller than the leadless circuit carrying insulating substrate, thereby exposing a portion of the first side of the leadless circuit carrying insulating substrate about a perimeter of the protective cover.

3. The leadless pad array chip carrier package of claim 1, wherein the leadless circuit carrying insulating substrate is a glass reinforced printed circuit board.

4. The leadless pad array chip carrier package of claim 1, wherein the leadless circuit carrying insulating substrate is a flexible film.

5. The leadless pad array chip carrier package of claim 4, wherein the flexible film is selected from the group consisting of polyimide, polyester, or polyetherimide.

6. The leadless pad array chip carrier package of claim 1, wherein the semiconductor device is wire-bonded to the leadless circuit carrying insulating substrate.

7. The leadless pad array chip carrier package of claim 1, wherein the semiconductor device is tape automated bonded (TAB) to the leadless circuit carrying insulating substrate.

8. The leadless pad array chip carrier package of claim 1, wherein the semiconductor device is directly attached to the leadless circuit carrying insulating substrate.

9. The leadless pad array chip carrier package of claim 1, wherein the protective cover is a thermosetting resin or a thermoplastic resin.

10. A leadless pad array chip carrier package, comprising:

a leadless circuit carrying insulating substrate having opposing planar first and second sides;

a semiconductor device electrically and mechanically mounted on the first side of the circuit carrying substrate;

the substrate second side having a substantially coplanar array of surface mount solder pads arranged in checkerboard fashion to substantially cover the substrate second side, a portion of the array disposed below the semiconductor device;

solder bumps on the solder pads;

the semiconductor device electrically connected to the surface mount solder pads by means of vias through the leadless circuit carrying substrate, each of said vias positioned away from said surface mount solder pads; and a protective cover consisting of a resin transfer molded about the semiconductor device and covering a portion of the first side of the leadless circuit carrying substrate, to form a leadless pad array chip carrier.

11. A leadless pad array chip carrier package, comprising:

a printed circuit board having planar opposing first and second sides, said first side having a metallization pattern;

at least one semiconductor device mechanically attached to said metallization pattern;

wire bonds electrically connecting said semiconductor device to said metallization pattern;

a matrix of solder pads on and substantially coplanar to said printed circuit board second side, arranged in checkerboard fashion to substantially cover the substrate second side, a portion of said matrix under said semiconductor device;

conductive vias in the printed circuit board electrically connecting the matrix of solder pads to the metallization pattern, each of said conductive vias positioned away from said solder pads;

solder bumps on said solder pads; and a cover consisting of a thermosetting plastic resin transfer molded about said at least one semiconductor device and said wire bonds, and substantially covering said printed circuit board first side, said cover being smaller than said printed circuit board, thereby exposing a portion of said printed circuit board first side about a perimeter of said cover to form a leadless pad array chip carrier.

* * * * *